(12) United States Patent
Han

(10) Patent No.: US 7,420,399 B2
(45) Date of Patent: Sep. 2, 2008

(54) DUTY CYCLE CORRECTOR

(76) Inventor: Jonghee Han, 431 Drystack Way, Cary, NC (US) 27519

( * ) Notice: Subject to any disclaimer, the term of this patent is extended or adjusted under 35 U.S.C. 154(b) by 0 days.

(21) Appl. No.: 11/271,015

(22) Filed: Nov. 10, 2005

(65) Prior Publication Data

US 2007/0103216 A1  May 10, 2007

(51) Int. Cl.
*H03K 3/017* (2006.01)
*H03K 5/04* (2006.01)
*H03K 7/08* (2006.01)

(52) U.S. Cl. ...................... 327/175; 327/158

(58) Field of Classification Search ............... 327/175, 327/158, 172–174, 156, 161–163; 375/373, 375/376, 371
See application file for complete search history.

(56) References Cited

U.S. PATENT DOCUMENTS

| | | | |
|---|---|---|---|
| 6,125,157 A * | 9/2000 | Donnelly et al. | ............ 375/371 |
| 6,246,276 B1 | 6/2001 | Arkas et al. | |
| 6,677,792 B2 | 1/2004 | Kawk | |
| 6,687,844 B1 | 2/2004 | Zhang | |
| 6,765,421 B2 | 7/2004 | Brox et al. | |
| 7,116,143 B2 * | 10/2006 | Deivasigamani et al. | .... 327/149 |
| 2002/0084818 A1 * | 7/2002 | Cho | ........................... 327/175 |
| 2002/0196887 A1 * | 12/2002 | Heikkila | ...................... 375/371 |
| 2003/0201806 A1 | 10/2003 | Cho | |
| 2003/0219088 A1 | 11/2003 | Kwak | |
| 2004/0027182 A1 | 2/2004 | Brox et al. | |
| 2004/0155686 A1 * | 8/2004 | Kim et al. | ................... 327/158 |
| 2004/0251939 A1 | 12/2004 | Brox et al. | |
| 2004/0257134 A1 | 12/2004 | Minzoni | |
| 2005/0189979 A1 * | 9/2005 | Park | ........................... 327/291 |

* cited by examiner

*Primary Examiner*—Tuan T. Lam
*Assistant Examiner*—Diana J Cheng
(74) *Attorney, Agent, or Firm*—Dicke, Billig & Czaja, PLLC

(57) ABSTRACT

A duty cycle corrector includes a first controllable delay configured to delay a first signal to provide a second signal, a second controllable delay configured to delay the second signal to provide a third signal, a circuit configured to adjust the first controllable delay and the second controllable delay to phase lock the third signal to the first signal, and a phase mixer configured to phase mix the first signal and the third signal to provide a fourth signal.

21 Claims, 6 Drawing Sheets

DUTY CYCLE CORRECTOR

BACKGROUND

Many digital circuits receive a clock signal to operate. One type of circuit that receives a clock signal to operate is a memory circuit, such as a dynamic random access memory (DRAM), synchronous dynamic random access memory (SDRAM), or double data rate synchronous dynamic random access memory (DDR-SDRAM). In a memory circuit operating at high frequencies, it is important to have a clock signal that has about a 50% duty cycle. This provides the memory circuit with approximately an equal amount of time on the high level phase and on the low level phase for transferring data into and out of the memory circuit, such as latching rising edge data and latching falling edge data out of the memory circuit.

Often, a clock signal is provided by an oscillator, such as a crystal oscillator, and clock circuitry. The oscillator and clock circuitry may provide a clock signal that does not have a 50% duty cycle. For example, the clock signal may have a 45% duty cycle, where the high level phase is 45% of one clock cycle and the low level phase is the remaining 55% of the clock cycle. A duty cycle corrector receives the clock signal and corrects or changes the duty cycle of the clock signal to provide clock signals with transitions separated by substantially one half of a clock cycle.

One type of duty cycle corrector uses a single external clock signal to provide an internal clock signal and an inverted internal clock signal. Typically, there is some jitter on the external clock signal that is propagated to the internal clock signal and the inverted internal clock signal. If this jitter is too great, the jitter may affect operations performed using the internal clock signal and the inverted internal clock signal.

SUMMARY

One embodiment of the present invention provides a duty cycle corrector. The duty cycle corrector includes a first controllable delay configured to delay a first signal to provide a second signal, a second controllable delay configured to delay the second signal to provide a third signal, a circuit configured to adjust the first controllable delay and the second controllable delay to phase lock the third signal to the first signal, and a phase mixer configured to phase mix the first signal and the third signal to provide a fourth signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
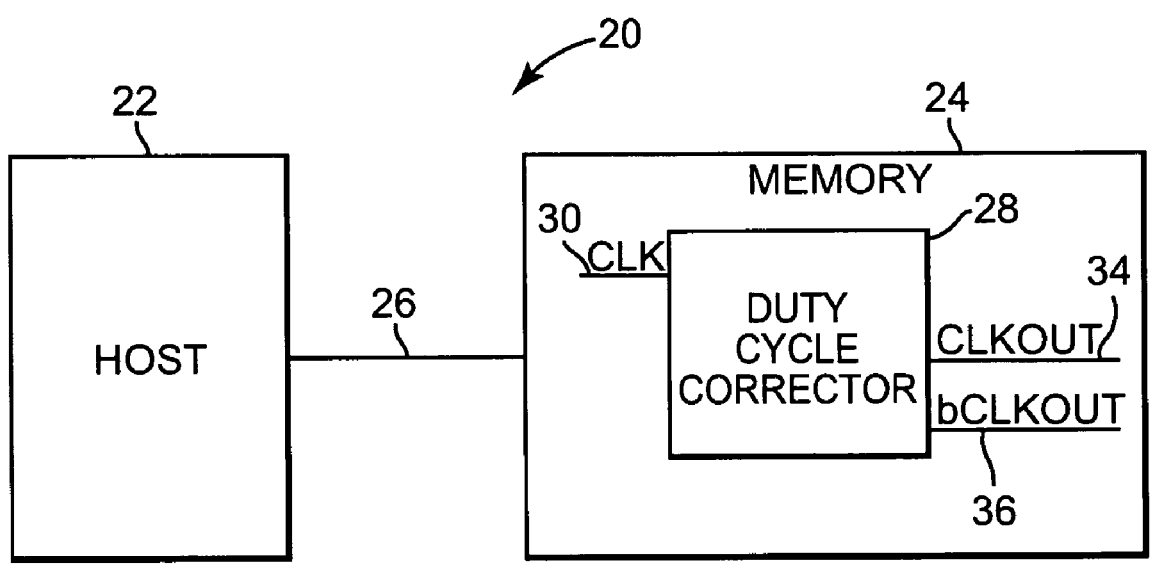
FIG. 1 is a block diagram illustrating one embodiment of an electronic system.

FIG. 1 is a block diagram illustrating one embodiment of an electronic system 20 according to the present invention. Electronic system 20 includes a host 22 and a memory circuit 24. Host 22 is electrically coupled to memory circuit 24 through memory communications path 26. Host 22 is any suitable electronic host, such as a computer system including a microprocessor or a microcontroller. Memory circuit 24 is any suitable memory, such as a memory that utilizes a clock signal to operate. In one embodiment, memory circuit 24 comprises a random access memory, such as a dynamic random access memory (DRAM), synchronous dynamic random access memory (SDRAM), or double data rate synchronous dynamic random access memory (DDR-SDRAM).

Memory circuit 24 includes a duty cycle corrector 28 that receives a clock (CLK) signal on CLK signal path 30. In one embodiment, duty cycle corrector 28 receives an external CLK signal on CLK signal path 30 through memory communications path 26. In other embodiments, duty cycle corrector 28 receives an external CLK signal on CLK signal path 30 from any suitable device, such as a dedicated clock circuit that is located inside or outside memory circuit 24.

Duty cycle corrector 28 provides the clock output (CLKOUT) signal on CLKOUT signal path 34 and the inverted clock output (bCLKOUT) signal on bCLKOUT signal path 36. The phase difference between the CLKOUT signal on CLKOUT signal path 34 and the bCLKOUT signal on bCLKOUT signal path 36 is substantially 50% (180 degrees). The CLKOUT signal is the inverse of the bCLKOUT signal. Duty cycle corrector 28 receives the CLK signal on CLK signal path 30, which may not have a 50% duty cycle, and provides the CLKOUT signal on CLKOUT signal path 34 and the bCLKOUT signal on bCLKOUT signal path 36. Memory circuit 24 receives the CLKOUT signal and the bCLKOUT signal to transfer data into and/or out of memory circuit 24.

Figure 2:
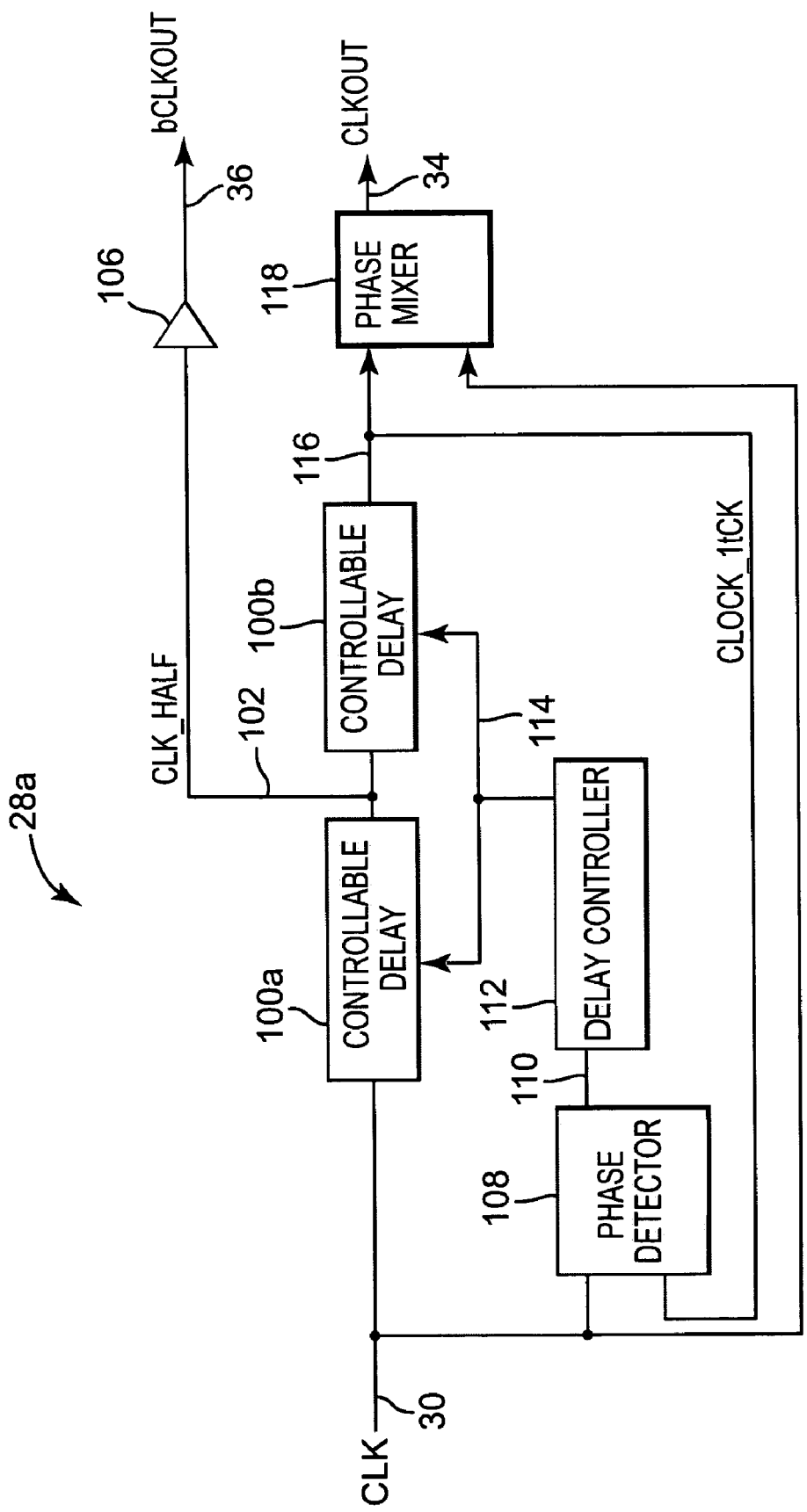
FIG. 2 is a block diagram illustrating one embodiment of a duty cycle corrector.

FIG. 2 is a block diagram illustrating one embodiment of a duty cycle corrector 28a. Duty cycle corrector 28a includes controllable delays 100a and 100b, buffer 106, phase detector 108, delay controller 112, and phase mixer 118. The input of controllable delay 100a, a first input of phase detector 108, and a first input of phase mixer 118 receive the CLK signal on CLK signal path 30. The output of controllable delay 100a is electrically coupled to the input of buffer 106 and the input of controllable delay 100b through clock half (CLK_HALF) signal path 102. The output of buffer 106 provides the bCLKOUT signal on bCLKOUT signal path 36. The output of controllable delay 100b is electrically coupled to a second input of phase detector 108 and a second input of phase mixer 118 through CLK_1tCK signal path 116. The output of phase detector 108 is electrically coupled to the input of delay controller 112 through signal path 110. The output of delay controller 112 is electrically coupled to the control input of controllable delay 100a and the control input of controllable delay 100b through signal path 114. The output of phase mixer 118 provides the CLKOUT signal on CLKOUT signal path 34.

Controllable delay 100a delays the CLK signal on CLK signal path 30 to provide the CLK_HALF signal on CLK_HALF signal path 102. The delay of controllable delay 100a is selected based on the control signal input to controllable delay 100a on signal path 114. Controllable delay 100a is any suitable type of variable delay, such as a series of inverters switched by the control signal input. Controllable delay 100b delays the CLK_HALF signal on CLK_HALF signal path 102 to provide the CLK_1tCK signal on CLK_1tCK signal path 116. The delay of controllable delay 100b is selected based on the control signal input on signal path 114. Controllable delay 100b is any suitable type of variable delay, such as a series of inverters switched by the control signal. In one embodiment, controllable delay 100b is similar to controllable delay 100a.

Phase detector 108 receives the CLK signal on CLK signal path 30 and the CLK_1tCK signal on CLK_1tCK signal path 116 to provide the signal on signal path 110. Phase detector 108 determines the phase difference between the CLK signal and the CLK_1tCK signal to provide a phase difference output signal on signal path 110. Delay controller 112 receives the phase difference signal on signal path 110 to provide a control signal on signal path 114. Delay controller 112 provides the control signal based on the phase difference signal to adjust the delay of controllable delay 100a and the delay of controllable delay 100b such that the CLK_1tCK signal is phase locked to the CLK signal.

Phase mixer 118 receives the CLK_1tCK signal on CLK_1tCK signal path 116 and the CLK signal on CLK signal path 30 to provide the CLKOUT signal on CLKOUT signal path 34. Phase mixer 118 averages the CLK_1tCK signal with the CLK signal to provide the CLKOUT signal having reduced jitter. In one embodiment, the jitter is reduced by approximately 50%. For example, if the CLK signal has 200 ps of jitter, then the CLKOUT signal has approximately 100 ps of jitter.

In operation, the CLK signal is delayed by controllable delay 100a to provide the CLK_HALF signal. In one embodiment, the CLK signal leads the CLK_HALF signal by one half clock cycle. Controllable delay 100b delays the CLK_HALF signal to provide the CLK_1tCK signal. In one embodiment, the CLK signal leads the CLK_1tCK signal by one clock cycle. Buffer 106 buffers the CLK_HALF signal to provide the bCLKOUT signal. The intrinsic delay of buffer 106 is approximately equal to the intrinsic delay of phase mixer 118. The CLK signal and the CLK_1tCK signal are compared by phase detector 108 to determine the phase difference between the CLK signal and the CLK_1tCK signal. The phase difference is passed to delay controller 112, which adjusts the delay of controllable delay 100a and the delay of controllable delay 100b to phase lock the CLK_1tCK signal to the CLK signal. The bCLKOUT signal is the inverse of the CLKOUT signal, and leads the CLKOUT signal by one half clock cycle.

Figure 3:
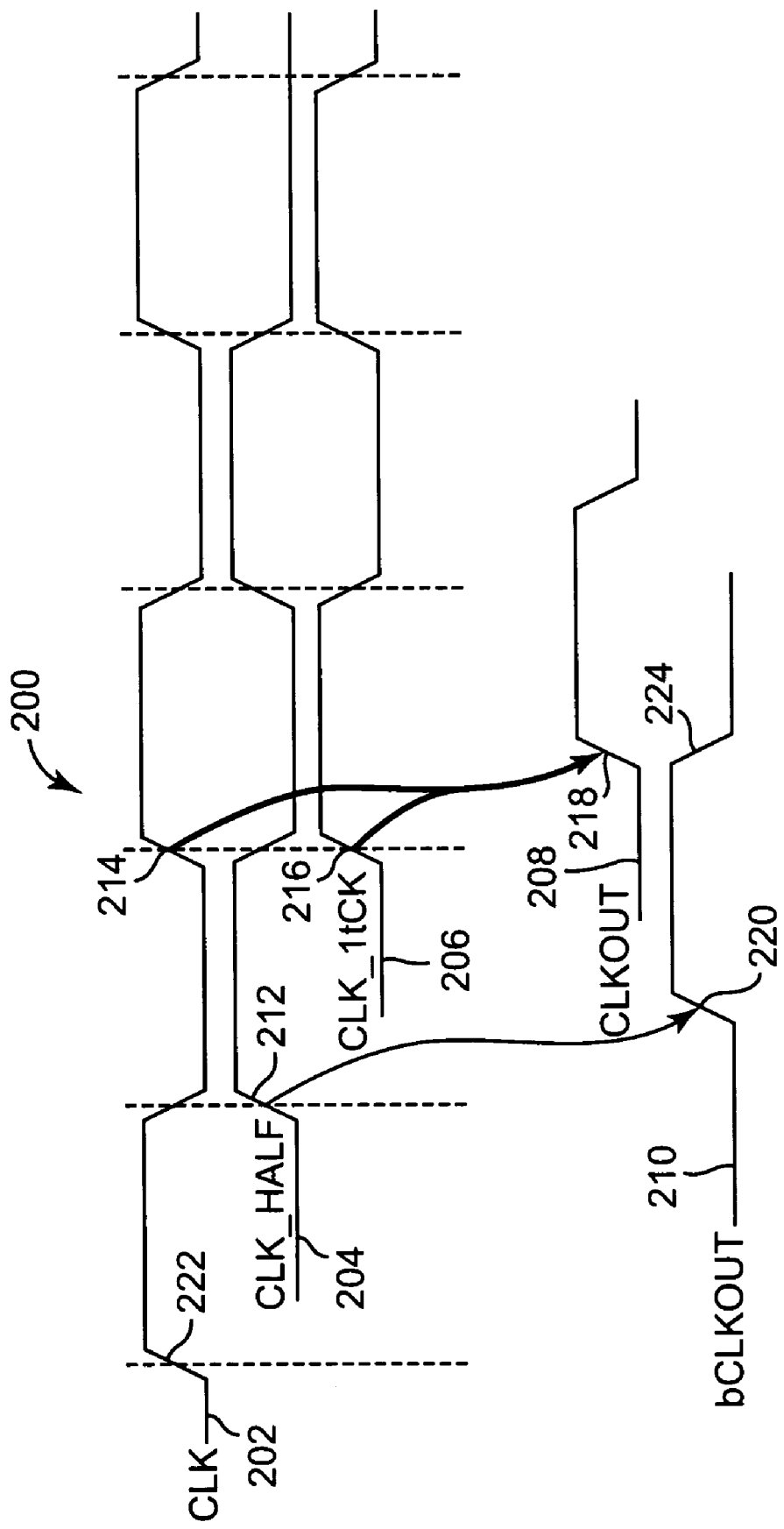
FIG. 3 is a timing diagram illustrating one embodiment of the timing of signals for the duty cycle corrector illustrated in FIG. 2.

FIG. 3 is a timing diagram 200 illustrating one embodiment of the timing of signals for duty cycle corrector 28a. Timing diagram 200 includes CLK signal 202 on CLK signal path 30, CLK_HALF signal 204 on CLK_HALF signal path 102, CLK_1tCK signal 206 on CLK_1tCK signal path 116, CLKOUT signal 208 on CLKOUT signal path 34, and bCLKOUT signal 210 on bCLKOUT signal path 36. Rising edge 222 of CLK signal 202 is delayed by controllable delay 100a to provide rising edge 212 of CLK_HALF signal 204. Rising edge 212 of CLK_HALF signal 204 is delayed by buffer 106 to provide rising edge 220 of bCLKOUT signal 210. Rising edge 212 of CLK_HALF signal 204 is delayed by controllable delay 102b to provide rising edge 216 of CLK_1tCK signal 206. Phase mixer 118 mixes rising edge 214 of CLK signal 202 and rising edge 216 of CLK_1tCK signal 206 to provide rising edge 218 of CLKOUT signal 208. CLKOUT signal 208 is the inverse of bCLKOUT signal 210 such that rising edge 218 of CLKOUT signal 208 is aligned with falling edge 224 of bCLKOUT signal 210. The phase difference between CLKOUT signal 208 and bCLKOUT signal 210 is approximately 50%. The jitter of CLKOUT signal 208 is approximately one half the jitter of CLK signal 202.

Figure 4:
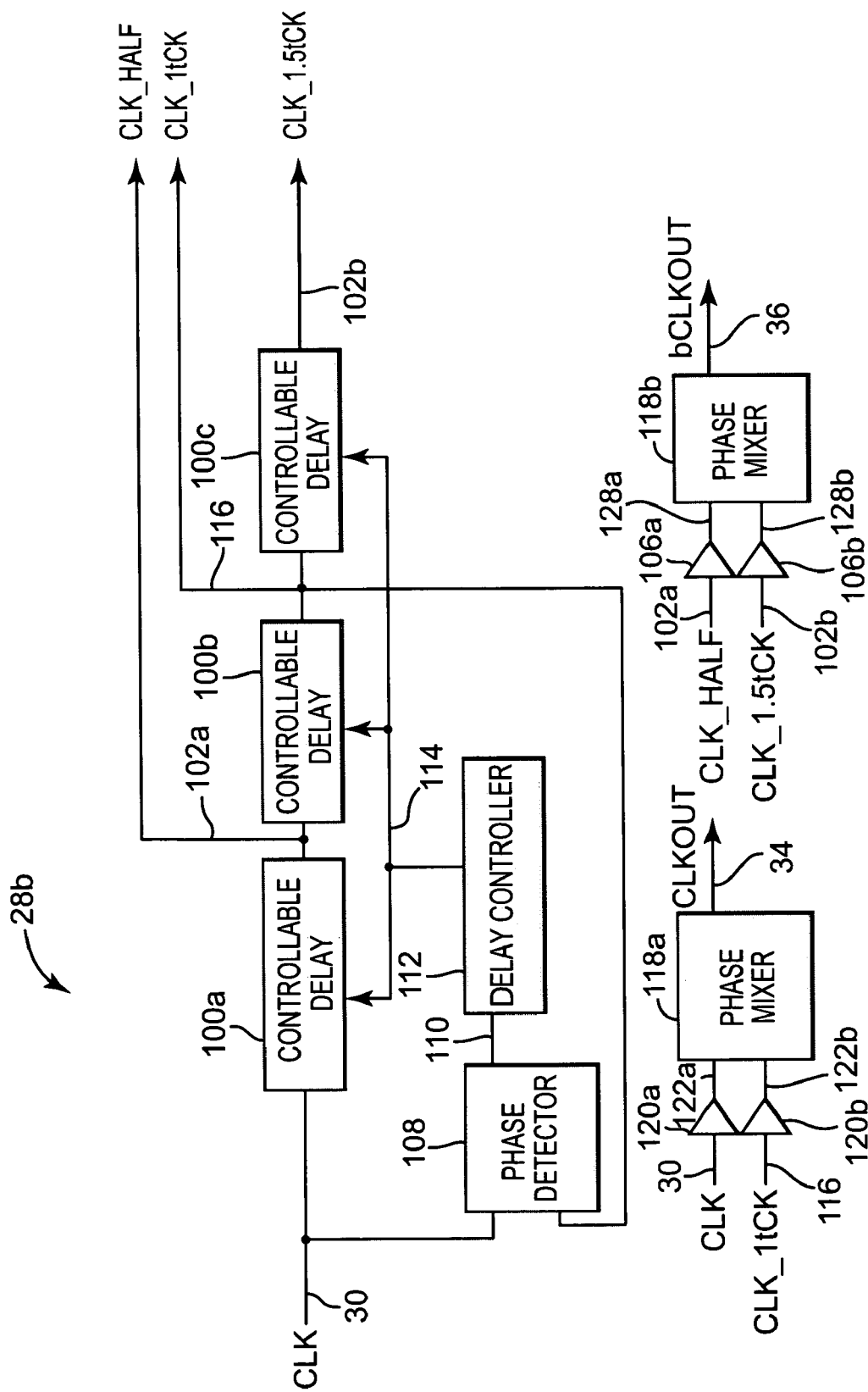
FIG. 4 is a block diagram illustrating another embodiment of a duty cycle corrector.

FIG. 4 is a block diagram illustrating another embodiment of a duty cycle corrector 28b. Duty cycle corrector 28b includes controllable delays 100a, 100b, and 100c, phase detector 108, delay controller 112, phase mixers 118a and 118b, and buffers 120a, 120b, 106a, and 106b. The input of controllable delay 100a, a first input of phase detector 108, and the input of buffer 120a receive the CLK signal on CLK signal path 30. The output of controllable delay 100a is electrically coupled to the input of controllable delay 100b and the input of buffer 106a through CLK_HALF signal path 102a. The output of controllable delay 100b is electrically coupled to the input of controllable delay 100c, the input of buffer 120b and a second input of phase detector 108 through CLK_1tCK signal path 116. The output of controllable delay 100c is electrically coupled to the input of buffer 106b through CLK_1.5tCK signal path 102b. The output of phase detector 108 is electrically coupled to the input of delay controller 112 through signal path 110. The output of delay controller 112 is electrically coupled to the control input of controllable delay 100a, the control input of controllable delay 100b, and the control input of controllable delay 100c through signal path 114.

The output of buffer 120a is electrically coupled to a first input of phase mixer 118a through signal path 122a. The output of buffer 120b is electrically coupled to a second input of phase mixer 118a through signal path 122b. Phase mixer 118a provides the CLKOUT signal on CLKOUT signal path 34. The output of buffer 106a is electrically coupled to a first input of phase mixer 118b through signal path 128a. The output of buffer 106b is electrically coupled to a second input of phase mixer 118b through signal path 128b. The output of phase mixer 118b provides the bCLKOUT signal on bCLKOUT signal path 36.

Controllable delay 100a, controllable delay 100b, phase detector 108, and delay controller 112 function similarly to the corresponding components in duty cycle corrector 28a previously described and illustrated with respect to FIG. 2. Buffer 120a buffers the CLK signal on CLK signal path 30 to provide a buffered CLK signal on signal path 122a. Buffer 120b buffers the CLK_1tCK signal on CLK_1tCK signal path 116 to provide a buffered CLK_1tCK signal on signal path 122b. Phase mixer 118a receives the buffered CLK signal on signal path 122a and the buffered CLK_1tCK signal on signal path 122b to provide the CLKOUT signal on CLKOUT signal path 34. Phase mixer 118a averages the buffered CLK_1tCK signal with the buffered CLK signal to provide the CLKOUT signal having reduced jitter. In one embodiment, the jitter is reduced by approximately 50%. For example, if the CLK signal has 200 ps of jitter, then the CLKOUT signal has approximately 100 ps of jitter.

Controllable delay 100c delays the CLK_1tCK signal on CLK_1tCK signal path 116 to provide the CLK_1.5tCK signal CLK_1.5tCK signal path 102b. The delay of controllable delay 100c is selected based on the control signal input on signal path 114. Controllable delay 100c is any suitable type of variable delay, such as a series of inverters switched by the control signal. In one embodiment, controllable delay 100c is similar to controllable delay 100a and controllable delay 100b.

Buffer 106a buffers the CLK_HALF signal on CLK_HALF signal path 102a to provide a buffered CLK_HALF signal on signal path 128a. Buffer 102b buffers the CLK_1.5tCK signal on CLK_1.5tCK signal path 102b to provide a buffered CLK_1.5tCK signal on signal path 128b. Phase mixer 118b receives the buffered CLK_HALF signal on signal path 128a and the buffered CLK_1.5tCK signal on signal path 128b to provide the bCLKOUT signal on bCLK-OUT signal path 36. Phase mixer 118b averages the buffered CLK_HALF signal with the buffered CLK_1.5tCK signal to provide the bCLKOUT signal having reduced jitter. In one embodiment, the jitter is reduced by approximately 50%. For example, if the CLK signal has 200 ps of jitter, then the bCLKOUT signal has approximately 100 ps of jitter.

In operation, the CLK signal is delayed by controllable delay 100a to provide the CLK_HALF signal. In one embodiment, the CLK signal leads the CLK_HALF signal by one half clock cycle. Controllable delay 100b delays the CLK_HALF signal to provide the CLK_1tCK signal. In one embodiment, the CLK signal leads the CLK_1tCK signal by one clock cycle. Controllable delay 100c delays the CLK_1tCK signal to provide the CLK_1.5tCK signal. In one embodiment, the CLK signal leads the CLK_1.5tCK signal by one and one half clock cycles.

The CLK signal and the CLK_1tCK signal are compared by phase detector 108 to determine the phase difference between the CLK signal and the CLK_1tCK signal. The phase difference is passed to delay controller 112, which adjusts the delay of controllable delay 100a, the delay of controllable delay 100b, and the delay of controllable delay 100c to phase lock the CLK_1tCK signal to the CLK signal. Phase mixer 118a mixes the buffered CLK signal and the buffered CLK_1tCK signal to provide the CLKOUT signal, and phase mixer 118b mixes the buffered CLK_HALF signal and buffered CLK_1.5tCK signal to provide the bCLKOUT signal. The bCLKOUT signal is the inverse of the CLKOUT signal, and leads the CLKOUT signal by one half clock cycle.

Figure 5:
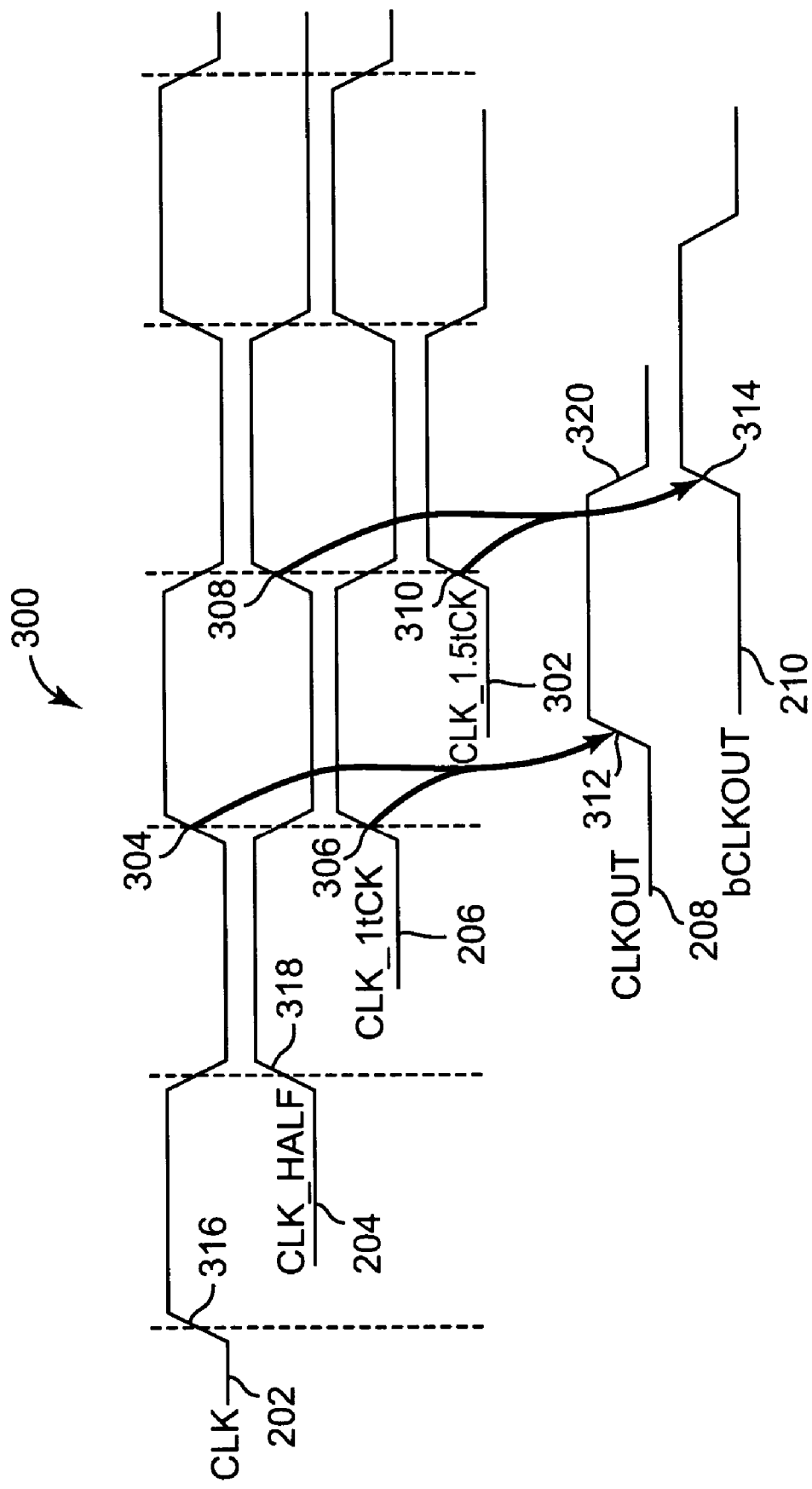
FIG. 5 is a timing diagram illustrating one embodiment of the timing of signals for the duty cycle corrector illustrated in FIG. 4.

FIG. 5 is a timing diagram 300 illustrating one embodiment of the timing of signals for duty cycle corrector 28b. Timing diagram 300 includes CLK signal 202 on CLK signal path 30, CLK_HALF signal 204 on CLK_HALF signal path 102a, CLK_1tCK signal 206 on CLK_1tCK signal path 116, CLK_1.5tCK signal 302 on CLK_1.5tCK signal path 102b, CLKOUT signal 208 on CLKOUT signal path 34, and bCLK-OUT signal 210 on bCLKOUT signal path 36.

Rising Edge 316 of CLK signal 202 is delayed by controllable delay 100a to provide rising edge 318 of CLK_HALF signal 204. Rising edge 318 of CLK_HALF signal 204 is delayed by controllable delay 100b to provide rising edge 306 of CLK_1tCK signal 206. Rising edge 306 of CLK_1tCK signal 206 is delayed by controllable delay 100c to provide rising edge 310 of CLK_1.5tCK signal 302. Phase mixer 118a mixes rising edge 304 of CLK signal 202 and rising edge 306 of CLK_1tCK signal 206 to provide rising edge 312 of CLKOUT signal 208. Phase mixer 118b mixes rising edge 308 of CLK_HALF signal 204 and rising edge 310 of CLK_1.5tCK signal 302 to provide rising edge 314 of bCLK-OUT signal 210. CLKOUT signal 208 is the inverse of bCLK-OUT signal 210 such that falling edge 320 of CLKOUT signal 208 is aligned with rising edge 314 of bCLKOUT signal 210. The phase difference between CLKOUT signal 208 and bCLKOUT signal 210 is approximately 50%. The jitter of CLKOUT signal 208 is approximately one half the jitter of CLK signal 202, and the jitter of bCLKOUT signal 210 is also approximately one half the jitter of CLK signal 202.

Figure 6:
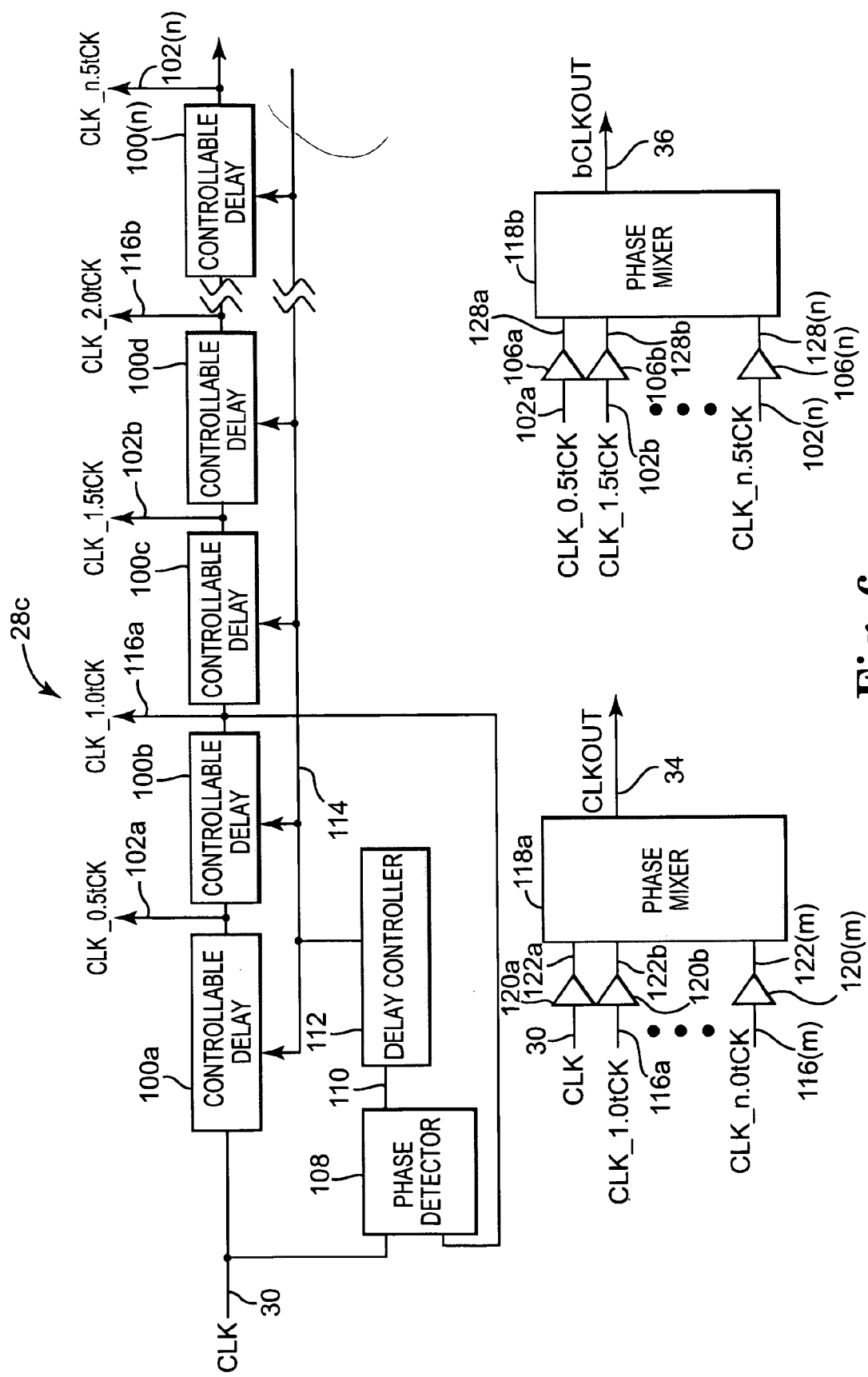
FIG. 6 is a block diagram illustrating another embodiment of a duty cycle corrector.

FIG. 6 is a block diagram illustrating another embodiment of a duty cycle corrector 28c. Duty cycle corrector 28c is an extension of duty cycle corrector 28b for further reducing clock jitter. Duty cycle corrector 28c includes controllable delays 100a-100(n), where n equals any suitable number of controllable delays. Duty cycle corrector 28c also includes phase detector 108, delay controller 112, buffers 120a-120(m) and 106a-106(n), and phase mixers 118a and 118b, where m=n−1.

The input of controllable delay 100a, a first input of phase detector 108, and the input of buffer 120a receive the CLK signal on CLK signal path 30. The output of controllable delay 100a is electrically coupled to the input of controllable delay 100b and the input of buffer 106a through CLK_0.5tCK signal path 102a. The output of controllable delay 100b is electrically coupled to the input of controllable delay 100c, a second input of phase detector 108, and the input of buffer 120b through CLK_1.0tCK signal path 116a. The output of controllable delay 100c is electrically coupled to the input of controllable delay 100d and the input of buffer 106b through CLK_1.5tCK signal path 102b. The output of controllable delay 100d is electrically coupled to the input of the next controllable delay 100 (not shown) and the input of the next buffer 120 (not shown) for phase mixer 118a through CLK_2.0tCK signal path 116b. The series of controllable delays 100 continues up to controllable delay 100(n). The output of controllable delay 100(n) is electrically coupled to the input of buffer 106(n) through CLK_n.5tCK signal path 102(n).

The output of phase detector 108 is electrically coupled to the input of delay controller 112 through signal path 110. The output of delay controller 112 is electrically coupled to the control inputs of controllable delays 100a-100(n) through signal path 114. The output of buffer 120a is electrically coupled to a first input of phase mixer 118a through signal path 122a. The output of buffer 120b is electrically coupled to a second input of phase mixer 118a through signal path 122b, and the output of buffer 120(m) is electrically coupled to the m$^{th}$ input of phase mixer 118a through signal path 122(m). The output of phase mixer 118a provides the CLKOUT signal on CLKOUT signal path 34.

The output of buffer 106a is electrically coupled to a first input of phase mixer 118b through signal path 128a. The output of buffer 106b is electrically coupled to a second input of phase mixer 118b through signal path 128b, and the output of buffer 106(n) is electrically coupled to the n$^{th}$ input of phase mixer 118b through signal path 128(n). The output of phase mixer 118b provides the bCLKOUT signal on bCLK-OUT signal path 36.

Controllable delay 100a, controllable delay 100b, controllable delay 100c, phase detector 108, delay controller 112, and buffers 120a, 120b, 106a, and 106b function similarly to the corresponding components in duty cycle corrector 28b previously described and illustrated with respect to FIG. 4. Controllable delay 100d delays the CLK_1.5tCK signal on CLK_1.5tCK signal path 102b to provide the CLK_2.0tCK signal CLK_2.0tCK signal path 116b. The delay of controllable delay 100d is selected based on the control signal input on signal path 114. Controllable delay 100d is any suitable type of variable delay, such as a series of inverters switched by the control signal. In one embodiment, controllable delay 100d is similar to controllable delays 100a-100c.

Controllable delay 100(n) delays the CLK_n.0tCK signal on CLK_n.0tCK signal path 116(m) to provide the CLK_n.5tCK signal on CLK_n.5tCK signal 102(n). The delay of controllable delay 100(n) is selected based on the control signal input on signal path 114. Controllable delay 100(n) is any suitable type of variable delay, such as a series of inverters switched by the control signal. In one embodiment, controllable delay 100(n) is similar to controllable delays 100a-100c.

Buffer 120(m) buffers the CLK_n.0tCK signal on CLK_n.0tCK signal path 116(m) to provide a buffered CLK_n.0tCK signal on signal path 122(m). Phase mixer 118a receives the buffered CLK signal on signal path 122a and the buffered CLK_1.0tCK signal through the buffered CLK_n.0tCK signal on signal paths 122b-122(m) to provide the CLKOUT signal on CLKOUT signal path 34. Phase mixer 118a averages the buffered CLK signal and the buffered CLK_1.0tCK signal through the buffered CLK_n.0tCK signal to provide the CLKOUT signal having reduced jitter. In one embodiment, the jitter is reduced by approximately 50% for each additional controllable delay 100 and corresponding input to phase mixer 118a. For example, if the CLK signal has 200 ps of jitter and m=4, then the CLKOUT signal has approximately 25 ps of jitter.

Buffer 106(n) buffers the CLK_n.5tCK signal on CLK_n.5tCK signal path 102(n) to provide a buffered CLK_n.5tCK signal on signal path 128(n). Phase mixer 118b receives the buffered CLK_0.5tCK signal on signal path 128a and the buffered CLK_1.5tCK signal through the buffered CLK_n.5tCK signal on signal paths 128b-128(n) to provide the bCLKOUT signal on bCLKOUT signal path 36. Phase mixer 118b averages the buffered CLK 0.5tCK signal and the buffered CLK_1.5tCK signal through the buffered CLK_n.5tCK signal to provide the bCLKOUT signal having reduced jitter. In one embodiment, the jitter is reduced by approximately 50% for each additional controllable delay 100 and corresponding input to phase mixer 118b. For example, if the CLK signal has 200 ps of jitter and n=3, the bCLKOUT signal has approximately 50 ps of jitter.

In operation, the CLK signal is delayed by controllable delay 100a to provide the CLK_0.5tCK signal. In one embodiment, the CLK signal leads the CLK_0.5tCK signal by one half clock cycle. Controllable delay 100b delays the CLK_0.5tCK signal to provide the CLK_1.0tCK signal. In one embodiment, the CLK signal leads the CLK_1.0tCK signal by one clock cycle. Controllable delay 100c delays the CLK_1.0tCK signal to provide the CLK_1.5tCK signal. In one embodiment, the CLK signal leads the CLK_1.5tCK signal by one and one half clock cycles. Controllable delay 100d delays the CLK_1.5tCK signal to provide the CLK_2.0tCK signal, and controllable delay 110(n) delays the CLK_n.0tCK signal to provide the CLK_n.5tCK signal. In one embodiment, the CLK signal leads the CLK_2.0tCK signal by two clock cycles, and the CLK signal leads the CLK_n.5tCK signal by n plus one half clock cycles.

The CLK signal and the CLK_1.0tCK signal are compared by phase detector 108 to determine the phase difference between the CLK signal and the CLK_1.0tCK signal. The phase difference is passed to delay controller 112, which adjusts the delay of controllable delays 100a-100(n) to phase lock the CLK_1.0tCK signal to the CLK signal. Phase mixer 118a mixes the buffered CLK signal and the buffered CLK_1.0tCK signal through the buffered CLK_n.0tCK signal to provide the CLKOUT signal, and phase mixer 118b mixes the buffered CLK_0.5tCK signal and buffered CLK_1.5tCK signal through the buffered CLK_n.5tCK signal to provide the bCLKOUT signal. The bCLKOUT signal is the inverse of the CLKOUT signal, and leads the CLKOUT signal by one half clock cycle.

Embodiments of the present invention provide a duty cycle corrector for a memory, such as a dynamic random access memory. The duty cycle corrector is configured to provide approximately a 50% phase difference between an internal clock signal and an inverted internal clock signal. The jitter of the internal clock signal and the jitter of the inverted internal clock signal is less than the jitter of the external clock signal. By selecting the number of controllable delays and corresponding phase mixers for the duty cycle corrector, the jitter of the internal clock signal and the jitter of the inverted internal clock signal can be reduced by approximately 50% for each additional controllable delay.

What is claimed is:

1. A duty cycle corrector comprising:
   a first controllable delay configured to delay a first signal to provide a second signal;
   a second controllable delay configured to delay the second signal to provide a third signal;
   a circuit configured to adjust the first controllable delay and the second controllable delay to phase lock the third signal to the first signal; and
   a phase mixer configured to phase mix only the first signal and the third signal to provide a fourth signal.

2. The duty cycle corrector of claim 1, wherein a phase difference between the second signal and the fourth signal is approximately 50%.

3. The duty cycle corrector of claim 1, wherein the fourth signal has less jitter than the first signal.

4. The duty cycle corrector of claim 3, wherein the fourth signal has approximately 50% less jitter than the first signal.

5. The duty cycle corrector of claim 1, further comprising:
   a buffer configured to receive the second signal and provide a fifth signal inverse to the fourth signal.

6. A duty cycle corrector for a memory comprising:
   a first controllable delay configured to delay a first clock signal by one half clock cycle to provide a second clock signal;
   a second controllable delay configured to delay the second clock signal by one half clock cycle to provide a third clock signal;
   a third controllable delay configured to delay the third clock signal by one half clock cycle to provide a fourth clock signal;
   a fourth controllable delay configured to delay the fourth clock signal by one half clock cycle to provide a fifth clock signal;
   a fifth controllable delay configured to delay the fifth clock signal by one half clock cycle to provide a sixth clock signal,
   a phase detector configured to determine a phase difference between the first clock signal and the third clock signal;
   a delay controller configured to adjust the first controllable delay and the second controllable delay based on the phase difference to phase lock the third clock signal to the first clock signal;
   a first phase mixer is configured to phase mix the first clock signal, the third clock signal, and the fifth clock signal to provide an internal clock signal, and
   a second phase mixer is configured to phase mix the second clock signal, the fourth clock signal, and the sixth clock signal to provide an inverted internal clock signal.

7. The duty cycle corrector of claim 6, wherein a phase difference between the inverted internal clock signal and the internal clock signal is approximately 50%.

8. The duty cycle corrector of claim 6, wherein the internal clock signal is used to transfer data into and out of the memory.

9. A duty cycle corrector comprising:
   means for delaying an external clock signal to provide a first clock signal;

means for delaying the first clock signal to provide a second clock signal;

means for phase locking the second clock signal to the external clock signal; and means for providing a duty cycle, corrected internal clock signal having less jitter than the external clock signal based on only the external clock signal and the second clock signal.

10. The duty cycle corrector of claim 9, wherein a phase difference between the internal clock signal and the first clock signal is approximately 50%.

11. The duty cycle corrector of claim 9, further comprising:

means for providing an inverted internal clock signal based on the first clock signal.

12. The duty cycle corrector of claim 11, wherein a phase difference between the inverted internal clock signal and the internal clock signal is approximately 50%.

13. The duty cycle corrector of claim 9, further comprising:

means for delaying the second clock signal to provide a third clock signal; and means for providing an inverted internal clock signal having less jitter than the external clock signal based on the first clock signal and the third clock signal.

14. A method for correcting the duty cycle of a first signal, the method comprising:

delaying the first signal a first selectable time to provide a second signal;

delaying the second signal a second selectable time to provide a third signal;

adjusting the first selectable time and the second selectable time to phase lock the third signal to the first signal; and phase mixing only the first signal and the third signal to provide a duty cycle corrected internal clock signal having less jitter than the first signal.

15. The method of claim 14, wherein delaying the second signal comprises delaying the second signal the second selectable time to provide the third signal having a phase difference of approximately 50% from the second signal.

16. The method of claim 14, further comprising:

buffering the second signal to provide a fifth signal inverse to the internal clock signal.

17. The method of claim 14, further comprising:

delaying the third signal a third selectable time to provide a fifth signal; and phase mixing the second signal and the fifth signal to provide a sixth signal having less jitter than the first signal, the sixth signal inverse to the internal clock signal.

18. The method of claim 17, wherein delaying the third signal comprises delaying the third signal to provide the fifth signal having a phase difference of approximately 50% from the third signal.

19. A method for correcting the duty cycle of a clock signal in a memory, the method comprising:

delaying an external clock signal through a first controllable delay to provide a first clock signal;

delaying the first clock signal through a second controllable delay to provide a second clock signal;

delaying the second clock signal through a third controllable delay to provide a third clock signal:

delaying the third clock signal through a fourth controllable delay to provide a fourth clock signal:

delaying the fourth clock signal through a fifth controllable delay to provide a fifth clock signal:

controlling the first controllable delay and the second controllable delay based on a phase difference between the external clock signal and the second clock signal to phase lock the second clock signal to the external clock signal;

controlling the third controllable delay based on the phase difference between the external clock signal and the second clock signal; and controlling the fourth controllable delay and the fifth controllable delay based on the phase difference between the external clock signal and the second clock signal;

phase mixing the external clock signal, the second clock signal, and the fourth clock signal to provide the internal clock signal; and phase mixing the first clock signal, the third clock signal, and the fifth clock signal to provide the inverted internal clock signal.

20. The method of claim 19, wherein delaying the first clock signal comprises delaying the first clock signal to provide the second clock signal having a phase difference of approximately 50% from the first clock signal.

21. The method of claim 19, wherein delaying the external clock signal comprises delaying the external clock signal to provide the first clock signal having a phase difference of approximately 50% from the external clock signal.

* * * * *

UNITED STATES PATENT AND TRADEMARK OFFICE
CERTIFICATE OF CORRECTION

| | | |
|---|---|---|
| PATENT NO. | : 7,420,399 B2 | Page 1 of 1 |
| APPLICATION NO. | : 11/271015 | |
| DATED | : September 2, 2008 | |
| INVENTOR(S) | : Jonghee Han et al. | |

It is certified that error appears in the above-identified patent and that said Letters Patent is hereby corrected as shown below:

Title page, Item (76) Inventors: should read:

--(76) Inventors:  Jonghee Han

Jung Pill Kim--.

Signed and Sealed this

Twenty-seventh Day of November, 2012

David J. Kappos
*Director of the United States Patent and Trademark Office*